United States Patent [19]
Roch

[11] 3,939,414
[45] Feb. 17, 1976

[54] MICRO-CIRCUIT TEST APPARATUS

[75] Inventor: Jacques Leon Roch, San Jose, Calif.

[73] Assignee: Electroglas, Inc., Santa Clara, Calif.

[22] Filed: Jan. 28, 1974

[21] Appl. No.: 436,844

[52] U.S. Cl............ 324/158 F; 324/72.5; 324/158 P
[51] Int. Cl.[2].................. G01R 31/02; G01R 31/22
[58] Field of Search............ 324/158 F, 158 P, 72.5, 324/149

[56] References Cited
UNITED STATES PATENTS 3,648,169  3/1972  Wiesler............................ 324/158 F
3,781,681  12/1973  Wagner et al................... 324/158 P OTHER PUBLICATIONS
"Future Probers . . .", EDN, Nov. 11, 1968, 2 pp.

Primary Examiner—R. V. Rolinec
Assistant Examiner—Ernest F. Karlsen
Attorney, Agent, or Firm—Ellsworth R. Roston

[57] ABSTRACT

Testing of integrated circuit components of the silicon wafer type is accomplished by a test probe assembly mounted on a support table, the latter being spaced vertically with respect to a platform on which the circuit components are placed. The test probe assembly, which includes a probe test unit, is mounted on the support in such a fashion that the test probe may be moved to a precise predetermined position corresponding to the precise location of that portion of the integrated circuit to be tested. This is accomplished by mounting the assembly housing such that it moves arcuately with respect to its support structure, while providing a slide unit within the housing which is movable vertically as well as axially with respect to the housing. Once the proper predetermined position has been determined and the test probe assembly adjusted such that the probe is properly aligned with the particular portion of the integrated circuit to be tested, the entire assembly is maintained in proper position. Thereafter, by computer control, the platform supporting the integrated circuits to be tested is indexed in accordance with the predetermined program and each of the particular circuits of the integrated circuit units is tested in the desired sequence. The test probe assembly housing includes separate rotatable adjusting members which independently bring about axial and vertical movement of the slide member upon which the test probe is mounted. The probe test unit, supported by the slide, is connected by means of a cable to a suitable external control circuit for testing the individual circuits on the integrated circuit wafer. Also described is an improved probe arm assembly having a needle tip which operates to reduce the capacitive effect between closely spaced probe arms.

16 Claims, 10 Drawing Figures

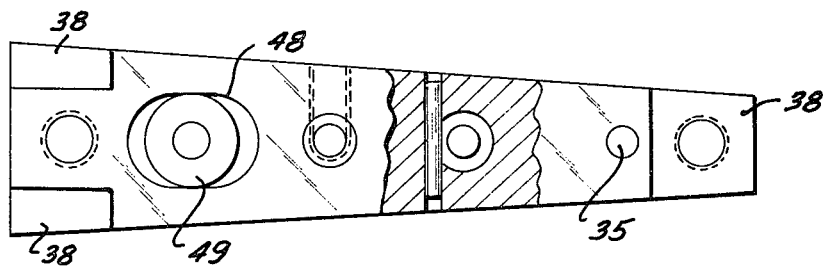
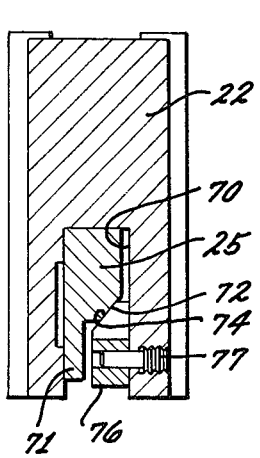
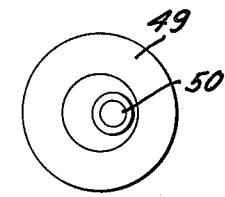
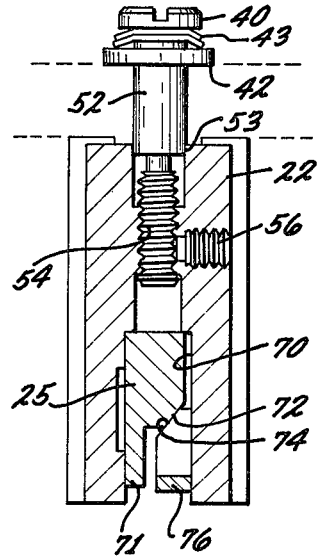
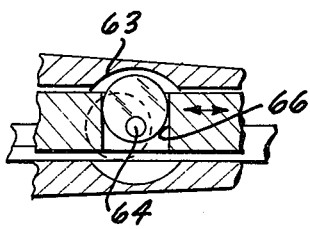
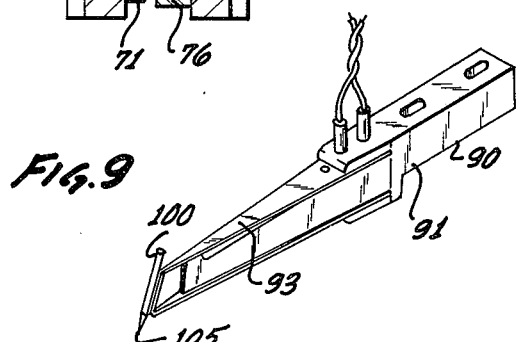
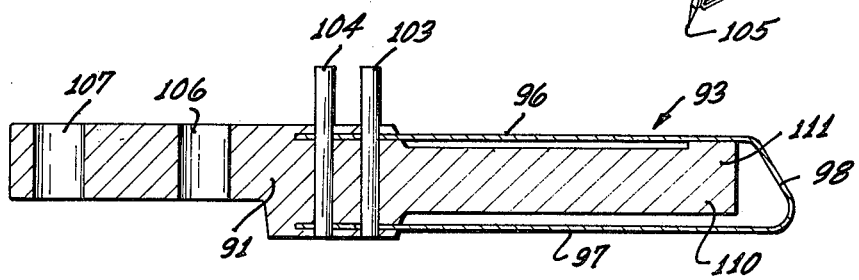

MICRO-CIRCUIT TEST APPARATUS

RELATED APPLICATION

Reference is made to U.S. application Ser. No. 366,421 filed June 4, 1973, now U.S. Pat. No. 3,851,249, and assigned to the same assignee.

BACKGROUND OF THE INVENTION

In the current art of electronic circuits, integrated circuits or micro-circuits are fabricated in such a manner that thin semiconductor slices having a multiplicity of individual matrices or micro-circuits are formed. In the usual practice in the art, the slices contain multiple identical repeating matrices of the same type of micro-circuit or integrated circuit unit. The individual unit is sometimes referred to as an integrated circuit chip.

The present practice is to test each of the circuits of each integrated circuit chip formed on the semiconductor wafer prior to separating the wafer into the desired individual integrated circuit components. In some instances, the individual integrated circuit unit may contain multiple circuits, and it is therefore desirable to test each of the circuits of the integrated circuit unit before the wafer is cut into individual integrated circuit units.

Since each micro-circuit of each wafer is normally in a predetermined precise relationship with respect to the adjacent circuit units, it is possible to test the circuitry if a probe can be accurately located on each preselected point corresponding to the circuit to be tested. It is possible, for example, to test several different circuits at the same time, or the same circuit of several different integrated circuit units. Thus, it is possible that adjacent probe arms may be positioned relatively closely to each other, in which event any capacitive coupling between adjacent probes should be avoided in order to obtain reliable test data.

Obviously, the positioning of the probes must be quite accurate and adjustable such that different integrated circuit units may be tested. Once the probes have been properly oriented, the wafer may be stepped from position to position so that each micro-circuit is properly located relative to the cooperative probe units for appropriate testing.

One of the difficulties which has occurred in prior art devices is the accurate positioning of the probe such that meaningful test data may be obtained. For example, if the predetermined position of the probe varies during the test of any specific wafer which includes a multiple of circuit units, the probe may not contact the proper circuit point resulting in a "reject". In fact, the particular component being tested may be quite operative, and the reject signal is generated simply because of improper contact between the test probe and circuit under analysis. Similarly capacitive effects may adversely affect the reliability of the data.

Accordingly, it is desirable to provide an assembly for testing integrated circuit components in which the assembly includes a test probe asembly made up of a housing and a test probe, the probe assembly being adjustable in a controlled accurate manner such that the probe tip may be oriented precisely in a predetermined position.

The orientation in a predetermined position may be defined as a precise location referenced by XY coordinates, and a vertical position defined by a Z coordinate. Since the wafer is generally planar, the proper vertical position if the probes used in testing must be closely controlled in order to obtain uniform contact pressure between each probe tip and each circuit.

After the predetermined position of the test probe has been established, it is desirable to provide some way of maintaining the test probe assembly in the proper orientation such that the test probe will not vary from its preselected position from one test to another in a particular series.

It is also desirable to be able to provide for rapid accurate adjustment of the test probe position as may be needed when different types of wafers are being tested in which there are differences in the circuits of one wafer to the next wafer.

Another desirable objective is to provide a probe arm assembly in which possible capacitive coupling between adjacent probes is substantially reduced or eliminated thereby enabling close positioning of the probes, or if in spaced relation, being assured that there is little, if any, capacitive coupling.

SUMMARY OF THE INVENTION

This invention relates to an improved assembly for testing integrated circuits in which an improved probe assembly may be oriented in a predetermined position relative to a desired point easily, accurately, and maintained in that predetermined position.

In accordance with the present invention, the assembly for testing the integrated circuit components includes a platform which supports the integrated circuit components, the platform being normally movable in an XY coordinate step by step movement, with a vertical movement following each indexing movement. The vertical movement of the platform, the latter accurately positioned and controlled in a horizontal plane, brings the supported integrated circuit component to be tested into contact with a probe test unit mounted on a probe assembly supported by a ring positioned around the outer perimeter of the platform. The ring may support one or more probe assemblies, each of which must be precisely positioned such that the probe test unit may contact the precise portion of the circuit being tested in each component of the wafer.

The probe assembly includes a housing which is adjustable arcuately with respect to the support, the housing including a slide member movable axially and vertically with respect to the housing, i.e. radially with respect to the ring, the slide assembly carrying on it a test probe which contacts the appropriate point of each integrated circuit component.

Axial and vertical movement of the slide is effected by rotating means supported by the housing, with separate rotating means controlling independently the axial and vertical movement. The housing itself may be moved arcuately by a rotatable member which causes arcuate movement of the housing with respect to a particular pivot point.

Cooperating with the slide is a slide retaining spring which maintains the pressure on the slide, and retains it within the housing, such that once the probe tip has been accurately and precisely positioned, the slide is held relatively immovable until such time as it is necessary to re-orient the probe tip with respect to a different location for testing different integrated circuits.

The improved probe arm assembly incorporates a needle probe tip mounted on a flexure arm supported by a dielectric support arm. The flexure arm is preloaded to control contact pressure between the needle probe and the tested substrate, especially if there is some overtravel during the vertical movement of the platform. The use of a needle probe, of substantially reduced surface area also reduces substantially any capacitive coupling between adjacent probes.

It will be apparent to those skilled in the art that the apparatus of the present invention is not to be considered to be limited to the specific constructions illustrated and described herein. Rather, the specific construction shown and described herein is illustrative of a preferred form of the present invention, and other embodiments and modifications will become apparent to those skilled in the art upon reading the following detailed description.

BRIEF DESCRIPTION OF THE DRAWINGS

FIG. 4 is a plan view, partly in section, of the top of the housing in accordance with the present invention;

FIG. 5 is an end view of the cam assembly used for arcuate adjustment of the housing in accordance with the present invention;

FIG. 6 is a view, partly in section and partly in elevation taken along the line 6 — 6 of FIG. 3;

FIG. 7 is a view partly in section and partly in elevation taken along the line 7 — 7 of FIG. 3;

FIG. 8 is a view partly in section and partly in elevation taken along the line 8 — 8 of FIG. 3;

FIG. 9 is a view in perspective of an improved probe arm assembly in accordance with this invention in which a needle probe tip is used; and FIG. 10 is a view in section taken along the line 10 — 10 of FIG. 9 with the needle tip removed.

DETAILED DESCRIPTION

Figure 1:
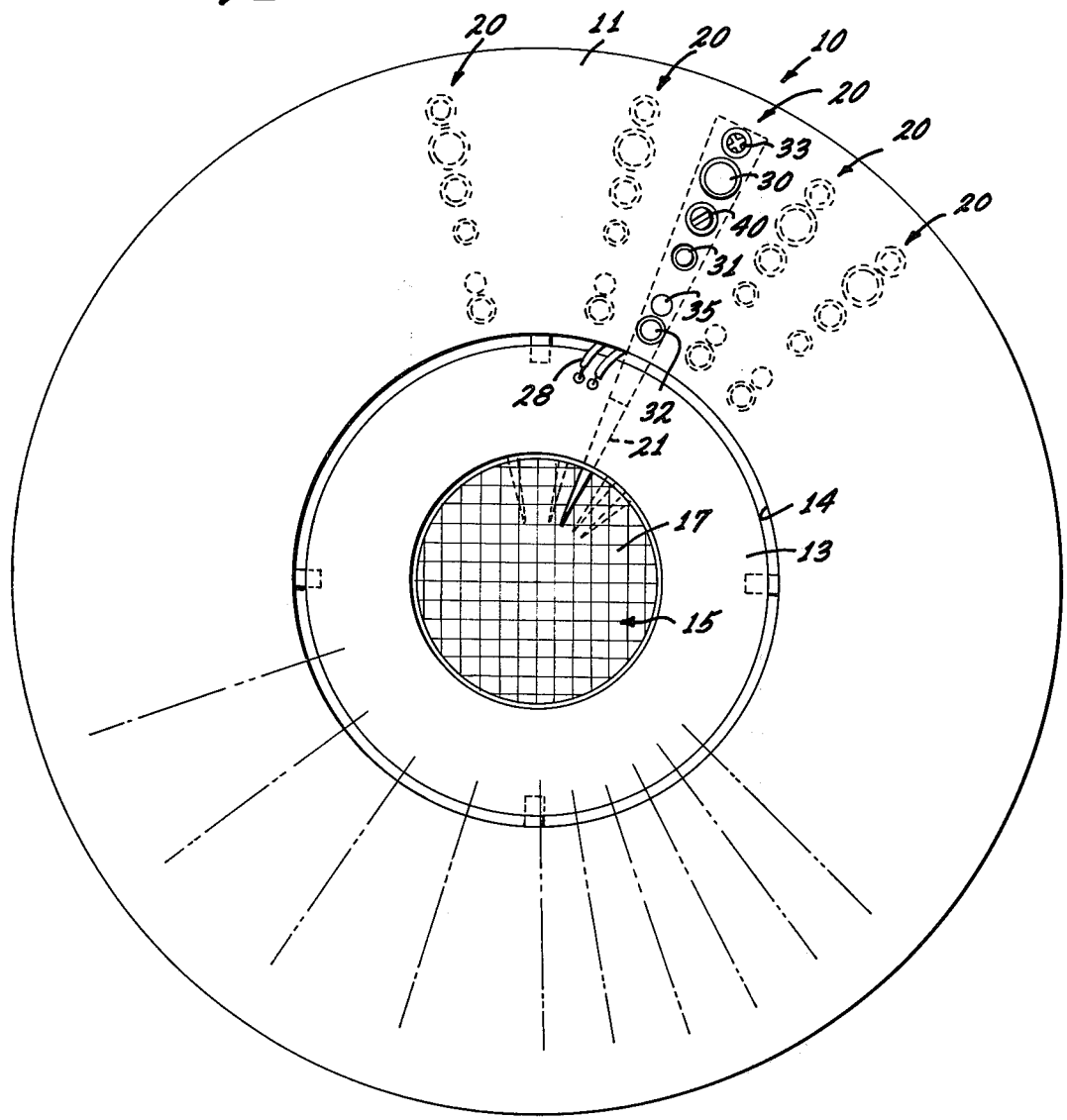
FIG. 1 is a somewhat diagrammatic plan view of the platform and support means upon which the probe assemblies are mounted in accordance with the present invention.

Referring to the drawings which illustrate an exemplary form of a preferred embodiment of the present invention, FIG. 1 shows an assembly 10 for testing integrated circuit components. A support ring 11 is mounted vertically above a generally circular platform 13, the latter being positioned within a bore 14 provided in the interior of the ring 11 as shown. Thus, the platform 13, whose orientation in a horizontal plane is accurately controlled, may be moved vertically without interference from the ring 11.

Platform 13 functions as a work table upon which may be mounted a wafer generally indicated 15, the latter formed with a grid pattern on its upper surface, the space between each grid, one of which is illustrated at 17, is provided with a micro-circuit of any desired type, formed by means well known in the art.

The work table 13 is normally moved in a direction parallel to the vertically oriented columns of the wafer, and parallel to the horizontally oriented rows of the wafer in a step-by-step indexing movement which is precise and accurate. Thus, each of the integrated circuit components illustrated for example at 17, may be located in a predetermined relative position such that each micro-circuit may be brought into position beneath the test probes supported by the ring. The work table generally is then moved vertically in order to bring the wafer in and out of vertical alignment with the probes as each micro-circuit is brought into testing position illustrated, for example, in FIG. 2.

Again referring to FIG. 1, the ring supports one or more test probe assemblies 20, the test probe assemblies being positioned radially with respect to the platform which is concentrically disposed with respect to the ring assembly 11. Each test probe assembly 20 includes a cooperating probe test unit 21 which makes contact with a predetermined selected component of the integrated circuit chip within a particular grid space. Thus, it becomes apparent that precise accurate control of the position of the probe test unit is needed in order to make proper contact with the particular circuit being tested. Accordingly, by the step wise indexing movement providing for an XY orientation of the platform 13, followed by a vertically upward movement thereof, a particular test probe may be precisely positioned with respect to any circuit component being tested.

One of the features of the present invention, is a structure which permits accurate alignment of the test probe with respect to a preselected position in each micro-circuit 17. From examination of FIGS. 1 and 2, it becomes apparent that the tip of the probe assembly must be precisely oriented at some point in space defined by three coordinates, X, Y and Z. In general, and in accordance with the present invention, the proper positioning of the probe with respect to the predetermined XY coordinates is accomplished by arcuate movement of the test probe assembly with respect to a pivot point located on the radial and movement axially towards and away from the center point of the platform. Controlled vertical movement is also accomplished such that the tip of each probe is disposed in the proper horizontal plane, the Z coordinate, such that as the platform is moved vertically, each probe contacts the proper circuit.

Figure 2:
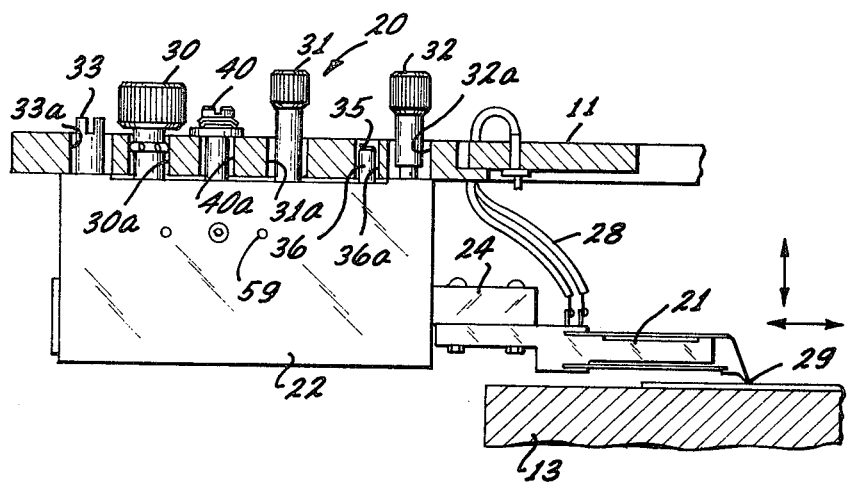
FIG. 2 is a side view, partly in section and partly elevation, illustrating the relative position of the probe assembly as mounted on the support ring and its relative position with respect to the platform in accordance with the present invention.
Figure 3:
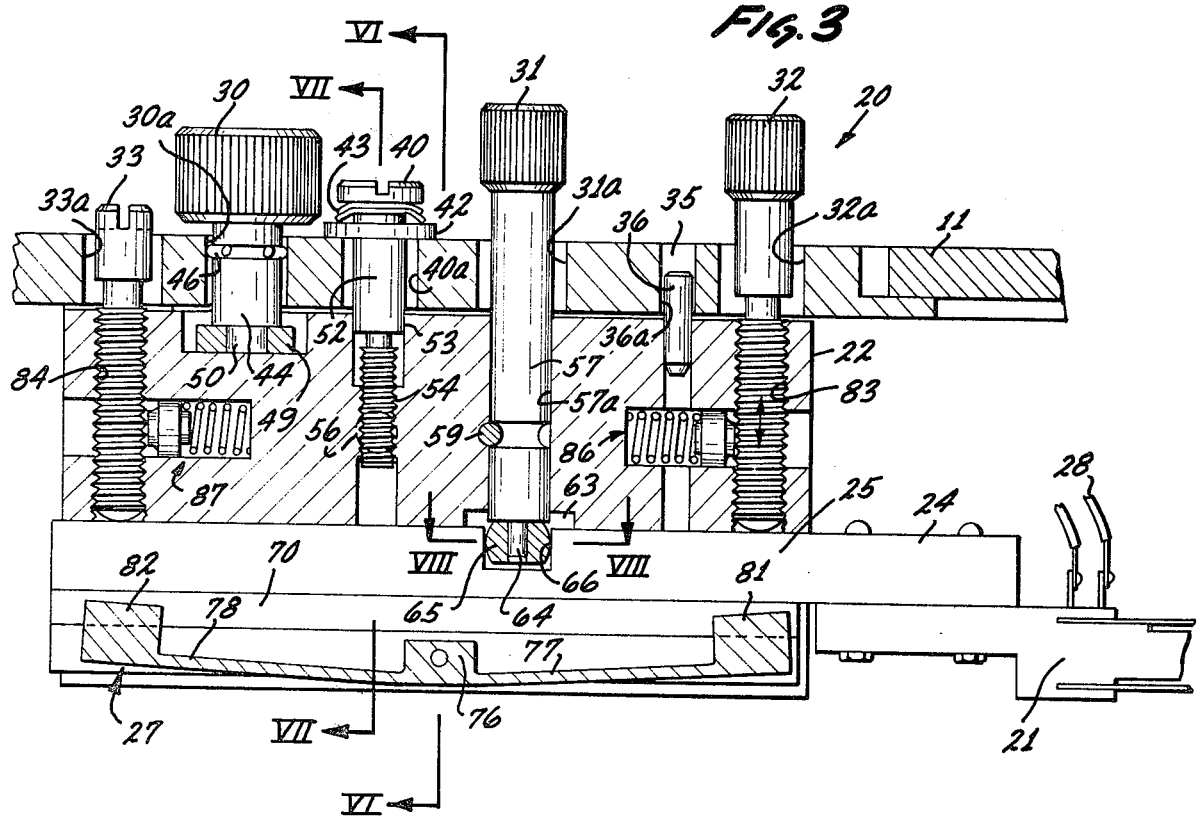
FIG. 3 is an enlarged view, partly in section and partly in elevation of the probe assembly in accordance with the present invention.

Referring to FIGS. 2 and 3, each test probe assembly 20 includes a housing 22 which incorporates a mounting for a probe test unit 21 such that the probe test unit 21 may be moved axially and vertically with respect to the housing. As illustrated, the probe test unit 21 is mounted on an arm 24, as illustrated, which extends from the housing. The arm 24 forms a continuation of a slide element 25, the latter being a portion of a slide assembly which also includes a slide retaining spring 27 resiliently bearing against the slide element 25, the slide element 25 and arm 24 being movable axially and vertically with respect to the housing 22.

Referring to FIG. 2, the housing 22 of the test assembly is mounted on the underside of the support ring 11 and so positioned that it does not interfere with the stepwise movement of the platform during the testing sequence. The probe test unit 21 includes cables 28 which plug into a terminal, as illustrated, the latter being connected to the test unit, as is known in the art. The probe test unit 21 may be of the type described more fully in application Ser. No. 366,421, previously identified, whose disclosure is incorporated herein by reference.

Orientation of the tip 29 of the probe test unit is accomplished by manipulating various rotatable control knobs which include an arcuate adjustment knob 30, a knob 31 for adjustment of axial positioning of the tip 29, and knobs 32 and 33 which effect vertical movement of the tip as will be described hereinafter. By manipulation of control knob 30, the housing 22 is caused to move arcuately about a pivot point 35 formed by a pin 36 accurately positioned in an aperture 36a provided in the ring 11.

As illustrated in FIGS. 1, 2 and 3, the support ring 11 is provided with several apertures, in alignment, and disposed on a line which corresponds approximately to a line extending radially from the center of the platform 13 outwardly towards the ring 11. Thus, as shown, support ring 11 is provided with apertures 30a, 31a, 32a and 33a, cooperating with the respective control knobs as will be described in more detail.

The housing 22 is supported by pressure pads 38 (FIG. 4) which engage the underside of the support ring 11, the pads operating as frictional surfaces to permit the controlled arcuate movement of the housing with respect to the support ring. The principal attaching means for the housing is formed by a mounting screw 40 which passes through an aperture 40a in the support ring 11. Between the underside of the screw head and the upper surface of the support ring 11, there is positioned a washer 42 whose periphery extends beyond the opening 40a, as seen in FIG. 3. Disposed between the washer 42 and the head of the screw 40 are a pair of spring washers indicated 43, the spring washers acting to urge the housing resiliently into engagement with the support ring 11.

In assembling the unit, the mounting screw 40 is tightened sufficiently to maintain the housing in a fixed position while permitting controlled arcuate movement.

Referring to FIG. 3, it will be seen that arcuate control knob 30 includes a shank 44, the latter provided with a groove which receives a generally toroidal split spring element 46. The outer portion of the spring element operates to maintain the shank centered and positioned within the aperture 30a.

As seen in FIG. 4, the upper surface of the housing includes a guideway 48 which cooperates with a bearing 49 received on an eccentrically mounted stub 50. The stub 50 is eccentrically positioned with respect to the shaft 44 of control knob 30, as illustrated in FIG. 5, for example. Thus, as the control knob 30 is rotated, the eccentric stub causes axial movement of the bearing 49 in the guideway 48 resulting in arcuate movement of the housing. As will be noted, the shaft 44 is maintained fixed relative to the support ring 11 by virtue of the spring 46 which engages the wall 30a. Thus, the effect of rotating the knob 30 is to provide arcuate movement of the housing relative to the pivot point 35. The sidewalls of the guideway 48 are proportioned with respect to the outer surface of the bearing 49 so as to permit arcuate movement without any axial movement of the housing, axial movement being prevented by the pivot pin 36. As earlier noted, since there is frictional engagement between the upper portion of the housing and the underside of the support ring, the tension on the mounting screw is preferably adjusted to permit movement of the housing while maintaining the housing in fixed position once the proper arcuate position has been achieved.

Referring to FIGS. 3 and 7, it will be noted that the mounting screw includes a shank 52 which is in intimate contact with the housing, as indicated at 53, the remaining portion of the shank being threaded and received within a threaded section 54 provided in the housing. Once the proper pressure has been set in the housing mounting, the position of the mounting screw 40 is locked by a set screw 56 (FIG. 7) such that the desired adjustment may be maintained.

Referring to FIGS. 3 and 8, axial movement of the slide 25 relative to the housing 22 is provided by the axial control knob 31, the latter including a shaft 57 received within the housing 22 and secured thereto by a pin 59 received within a groove. Thus, the shaft 57 is rotatable within its corresponding bore 57a but is not free to move axially.

The lower end of the bore 57a includes an enlarged generally circular counter bore 63, while the shank 57 of the axial control knob 31 includes an eccentric stud 64 which cooperates with a slide bearing 65 received on the stud. The slide, as indicated, includes a slot 66 which receives the bearing 65.

In operation, rotation of the knob 31 brings about eccentric motion of the stud 64 with generally circular motion of the cam bearing 65. Since the bearing is received within a slot 66 of the slide 25, the net effect is to bring about axial movement of the slide from a rearward position, to a forward axial position relative to the housing and to a rearward position. Thus, for each half revolution of the knob, the slide is advanced its full distance from the retracted to the forward position or from the forward to the retracted position, with a null point corresponding roughly to the 180° rotation of the control knob 31.

As illustrated in FIGS. 3, 6 and 7, the slide 25 is mounted for reciprocating axial movement with respect to the housing. To effect such sliding movement, the housing 22 is provided with a generally rectangular passageway 70 running the full length along the bottom portion thereof. As shown, the slide 25 is generally rectangular and includes a depending leg portion 71 running the full length of the slide. One face, 72 of the slide is beveled along the full length thereof and cooperates with the beveled face portion 74 of the spring 27.

The spring itself is formed with a center boss section 76 apertured to receive a retaining bolt 77, the spring including two legs generally indicated 77 and 78. Cooperating with each leg is a pad face 81 and 82, respectively, the pad face being inclined to match the beveled face 72 of the slide. Since the spring is held fixed at its center, and is free to flex at each end, the spring resiliently forces the slide in an upward direction with respect to the housing and operates as a biasing means to maintain both the axial and vertical positioning of the slide.

Vertical adjustment of the slide within the housing, and against the pressure of spring 27 is accomplished by the vertical slide adjusting mechanism composed of vertical adjusting knobs 32 and 33, the latter being in the nature of a gross adjustment mechanism, while knob 32 effects final controlled, accurate, vertical positioning of the arm.

To this end, the housing 22 includes two threaded bores 83 and 84 for vertical adjusting knobs 32 and 33 respectively, each bore being provided with a spring mounted pressure slide assembly 86 and 87, respectively, which bears against the threaded shank of the respective adjusting screws to maintain their position once they have been set. Vertical motion of the slide is achieved against the pressure of spring 27 which continually tends to urge the slide in a vertically upward direction.

In normal operation, the housing is mounted and adjusted arcuately, as described, and thereafter, the slide is adjusted axially with respect to the housing and vertically with respect to the housing such that the tip 29 of the probe is positioned at that point in space corresponding to a predetermined X, Y and Z coordinate. Once the final precise adjustment has been accomplished, the housing and the probe are maintained in the relative set position by means of the friction locks and biasing means described. If it is desired thereafter to vary the position of the tip point 29, this is easily accomplished by the accessible control knobs described.

One aspect of the present invention is an improved probe arm assembly which substantially reduces the capacitance between adjacent probe arm assemblies. Referring to FIGS. 9 and 10, a probe assembly 90 is illustrated, and includes a dielectric support member 91 which carries a flexure arm 93 in the form of an electrically conductive metal member which is generally U-shaped as indicated, including legs 96 and 97. The flexure member 93 includes a nose portion designated 98 which forms a mounting surface for a needle tip probe unit 100. As illustrated, the nose portion 98 is an essentially flat mounting surface included with respect to the horizontal.

The needle tip 100 is affixed to the mounting surface 98 in electrical contact therewith and is supported by the mounting surface and moves with the flexure member 93. By way of example, the needle is a carbide alloy or other selected alloy, the needle element itself being approximately 0.013 inch in diameter and plated with nickel so that it may be soldered to the mounting surface 98. The point 105 of the needle is approximately 1 mil. in diameter and forms the contact point for the circuit component to be tested, the current being carried through the point, through the legs 96 and 97 to a pair of contact terminals 103 and 104 electrically connected respectively to the legs 96 and 97, as illustrated. The free ends of the legs are fixed to the support body 91 by epoxy cement, and the support body includes mounting apertures 106 and 107 for mounting the probe assembly to a suitable movable support arm of the type previously described for effecting positioning of the point 105 at a predetermined point in space defined by X, Y and Z coordinates.

As illustrated, the support body includes an extending portion 110 disposed between legs 96 and 97 to limit the pivotal movement thereof, the extending portion 110 including a shoulder 111 at the tip end thereof to limit the downward rotation of the flexure member 93.

As shown in FIG. 9, each of the legs 96 and 97 of the flexure member 93 is tapered such that the transverse dimension thereof decreases. Accordingly, the transverse dimension of the mounting surface 98 is less than that of the adjacent legs. Likewise, the shape of the extending portion 110 of the support body is proportioned such that it is likewise tapered, as illustrated in the drawings.

In the form illustrated, the assembly achieves several singular advantages, the principal advantage being the reduction of capacitance between adjacent probe tips. By way of example, the probe tip illustrated in FIG. 2 is formed by a flat sheet, and where probe tips are positioned adjacent to each other, there may be adverse capacitance effects which may interfere with the testing procedure. Accordingly, by use of the tip illustrated in FIGS. 9 and 10, the capacitance effect is substantially reduced by significantly reducing the exposed lateral surface area of adjacent tips.

Moreover, the legs 96 and 97 of the flexure member 93 are preloaded to reduce the variation in contact pressure between the tip and the semiconductor device being tested.

By way of example, if the vertical movement of the platform is such that there is a slight amount of overtravel, for example several mils, the affect is to rotate the tip through a very minute arc which would in effect cause an axial displacement of the position of the tip with respect to its desired predetermined position. By preloading the tip, proper alignment is maintained until the vertical movement of the semiconductor is sufficient to overcome the preloading at which time there may be some small vertical movement of the tip point. However, since the tip is preloaded, the affect of overtravel is minimized in terms of the pressure which is applied against the semiconductor to be tested, and thus, there is little if any tendency to scratch or mar the surface of the chip.

The tip assembly of the type illustrated in FIGS. 9 and 10 may be preloaded to approximately 4.5 grams, and if one assumes that the added pressure created by overtravel is approximately 0.5 grams per mil, an overtravel of approximately 2.5 mils would produce an additional 1.5 grams of pressure. Thus, for a 2.5 mil overtravel, the total pressure is approximately 6 grams, a desirable pressure at the time of computer readout of the particular circuit being tested. Absent the preloading feature, the contact pressure may vary depending on the overtravel, and it is also possible to damage the component being tested because of the movement in the X, Y coordinate brought about by the axial overtravel of the platform and the circuit components carried thereon.

Preloading is accomplished by prestressing the legs such that in their normal state, they tend to curve downwardly as viewed in FIG. 10 at the free ends thereof, that is, the end opposite the nose portion 98. Thus, the preloading operates to maintain the one leg 96 in contact with the shoulder 111 which limits the downward movement and provides the preloading feature such that as the needle is moved in an upward direction, vertical movement of the needle does not occur until such time as the pressure exceeds the preloading point. The total vertical movement of the needle is limited by portion 110 which extends through the legs.

It will be apparent to those skilled in the arm from the foregoing description that an improved test probe assembly and probe arm assembly have been provided which offer singular advantages over the assemblies heretofore used in the art. The simplicity of adjustment to bring the test point into its predetermined position as well as the ease with which the position may be varied, as desired, are all practical advantages which have been sought after in prior art devices. Moreover, once adjusted in its proper predetermined position, the assemblies herein described tend to maintain their relative position until varied by an affirmative adjustment of the various control knobs, described.

Further, the improved probe assembly is a desirable structure in that it tends to reduce the capacitance effect between adjacent probe units and permits closer positioning of the probe arms than may be accomplished with some of the prior devices described.

While the above description and the accompanying drawings illustrate an exemplary embodiment of the preferred form of this invention, it will be understood by those skilled in the art that changes and modifications may be made to the various forms illustrated and described without departing from the scope of the invention as set forth in the appended claims.

I claim:
1. An assembly for testing integrated circuit components comprising:
   platform means supporting integrated circuit components to be tested,
   support means cooperating with said platform for mounting at least one test probe assembly in a predetermined position relative to said platform means,
   said probe assembly including a housing mounted on said support means for controlled arcuate movement with respect to said support means and said platform means,
   said housing including slide means mounting a probe test unit for controlled axial movement with respect to said housing,
   means assoociated with said housing for effecting controlled rotational movement of said slide means and said probe test unit and for effecting controlled rotational movement of said slide means about at least one of two points producing effecting vertical movement with respect to said housing with respect to said housing, and
   means to maintain said predetermined position of said housing and probe test unit with respect to said platform means.

2. An assembly as set forth in claim 1 wherein:
   slide means are mounted for controlled movement relative to said housing,
   said slide means being movable axially and vertically with respect to said housing, and
   said probe test unit being mounted for movement with said slide means.

3. An assembly as set forth in claim 2 wherein said slide means includes a movable slide arm and biasing means cooperating to maintain axial and vertical orientation of said slide arm.

4. An assembly as set forth in claim 1 wherein said housing includes means defining a pivot for arcuate movement, said pivot being at one end portion of said housing, and
   means in axial alignment with said pivot means and at the other end of said housing for effecting controlled arcuate movement of said housing about said pivot.

5. An assembly as set forth in claim 4 further including means cooperating with said housing and said support means to lock said housing in a predetermined arcuate orientation.

6. An assembly as set forth in claim 5 wherein said slide means are supported within said housing for axial and vertical movement with respect thereto.

7. An assembly as set forth in claim 2 wherein:
   said means for controlled movement includes slide actuating means cooperating to effect movement of said slide means, and
   rotary movement of said slide actuating means effecting said movement of said slide means with respect to said housing.

8. An assembly as set forth in claim 7 wherein slide actuating means includes separately operable means to effect axial and vertical movement of said slide.

9. An assembly as set forth in claim 8 wherein said means to effect vertical movement of said slide includes means independently operable to effect vertical movement of opposite ends of said slide whereby said slide may be oriented angularly with respect to said housing.

10. An assembly as set forth in claim 6 wherein arcuate, vertical and axial movement of said housing and slide are independently adjustable, said independent adjustment being effected by separate control means, and said separate control means being rotatable with respect to said housing.

11. An assembly as set forth in claim 10 wherein said support means includes means forming aligned apertures through which said separate control means extend.

12. A test probe assembly for use in testing microcircuits comprising:
   a housing,
   means to effect arcuate movement of said housing,
   slide means mounted for axial and vertical movement with respect to said housing,
   rotatable means cooperating with said housing to effect axial movement of said slide with respect to said housing and for effecting controlled rotational movement of said slide means about at least one of two points producing effective vertical movement with respect to said housing, and
   said slide including means for mounting a probe thereon for movement therewith.

13. A test probe assembly as set forth in claim 12 further including resilient means cooperating to maintain said slide means within said housing.

14. A test probe assembly as set forth in claim 12 wherein said rotatable means includes separate means for effecting vertical and axial movement of said slide,
   one of said separate means including a shaft rotatable within said housing,
   bearing means in driving relation with said slide, and
   means interconnecting said shaft and said bearing whereby rotation of said shaft effects axial movement of said slide.

15. A test probe assembly as set forth in claim 12 wherein the surface of said housing adapted to contact a support member includes spaced ribs.

16. A test probe assembly as set forth in claim 14 wherein the other of said separate means includes means movable into and out of said housing to effect vertical movement of said slide.

* * * * *